United States Patent [19]

Ullrich

[11] 4,254,345

[45] Mar. 3, 1981

[54] OUTPUT CIRCUIT FOR BUCKET-BRIGADE DEVICES

[75] Inventor: Manfred F. Ullrich, Denzlingen, Fed. Rep. of Germany

[73] Assignee: ITT Industries, Inc., New York, N.Y.

[21] Appl. No.: 40,828

[22] Filed: May 21, 1979

[51] Int. Cl.³ .................... G11C 19/28; H01L 29/78
[52] U.S. Cl. ........................... 307/221 D; 357/24; 307/DIG. 4
[58] Field of Search .............. 307/221 D, DIG. 4; 357/24

[56] References Cited

U.S. PATENT DOCUMENTS 3,819,954  6/1974  Butler et al. .................... 357/24

Primary Examiner—Gene M. Munson

Attorney, Agent, or Firm—John T. O'Halloran; Thomas N. Twomey

[57] ABSTRACT

To reduce the D.C drift of bucket-brigade devices having common output circuits (emitter follower), an output circuit is provided having an additional transistor and an additional capacitor. The terminal on the gate side of the capacitor associated with the last delaying transistor is not connected to the gate terminal but to the source terminal of the output transistor, the gate terminal of the terminating transistor is applied via the additional capacitor to that particular clock signal to which the penultimate delaying transistor is applied, and the drain terminal of the terminating transistor, via an enhancement-type transistor of the same conductivity, connected as a diode by directly connecting both the drain and the gate terminals, is connected to the gate terminal thereof.

1 Claim, 4 Drawing Figures

OUTPUT CIRCUIT FOR BUCKET-BRIGADE DEVICES

BACKGROUND OF THE INVENTION

This invention relates in general to bucket-brigade devices and more particularly to an output circuit for MOS bucket-brigade devices.

Prior art output circuits for bucket-brigade circuits consisting of insulated-gate field-effect transistors (MOS-bucket-brigade devices) are known to contain the terminating transistor mentioned in claim 1; as well as the output transistor in a source-follower circuit likewise referred to in claim 1, cf. "IEEE Journal of Solid-State Circuits", October 1972, pp. 421 to 425, in particular FIG. 1 on page 423, and April 1973, pp. 157 to 168, in particular FIG. 1a on page 158.

In accordance with this prior art, MOS-bucket-brigade devices consist of transistors of the same conductivity type, hence N- or P-channel transistors of the enhancement type, which are connected in series with their controlled current paths, with the drain and gate terminals thereof each being bridged by a capacitor, and with the gate terminals of the odd-numbered transistors being controlled in common by a first, preferably rectangular clock signal, and the gate terminals of the even-numbered transistors being controlled in common by a second, preferably rectangular, equi-frequency clock signal, with the effective pulses thereof lying in the gaps between the effective pulses of the first clock signal, cf. FIG. 1 of the accompanying drawing showing the even-numbered transistors T0, T2, the odd-numbered transistor T1, the penultimate delaying transistor Tm and the last delaying transistor Tn with the associated capacitors C0, C1, C2, Cm, Cn as well as the two clock signals, F1, F2.

According to FIG. 1, the output circuit consists of the already mentioned terminating transistor Ta which, with its controlled current path, is connected in series with that of the last delaying transistor Tn, and whose gate terminal is applied to that particular clock signal to which the penultimate delaying transistor Tm is connected, hence to the clock signal F1. The gate terminal of the output transistor Tb which is operated in a source-follower circuit, is applied to the point connecting the control current paths of both the terminating transistor Ta and the last delaying transistor Tn. The drain terminal of the output transistor Tb is applied to the constant supply voltage $U_B$ to which also the drain terminal of the terminating transistor Ta is applied. The source terminal of the output transistor Tb is applied to the output A of the MOS-bucket-brigade device whose input E serves as the source terminal of the input transistor T0.

In the conventional output circuit, the delayed signal is contained in an envelope curve, enveloping the clock frequency voltage. This envelope curve, at the positive end of the clock frequency voltage, extends in the same direction as at the negative end thereof, that is, the output voltage at the output A represents a band-shaped signal, with the width of the band being constant and merely varying in the rhythm of the envelope curve, hence of the delayed signal, in the same sense or direction towards above and below, cf. FIG. 2; the clock signal itself is indicated by the dashing. With the aid of low-pass filters to be arranged subsequently thereto, the clock frequency voltage may be suppressed in this band-shaped signal; practice has shown, however, that the clock frequency voltage has such a considerable proportion in the entire signal, that filtering is entailled by difficulties.

SUMMARY OF THE INVENTION

According to this invention there is provided an output circuit for bucket-brigade circuits consisting of insulated-gate field-effect transistors (MOS-bucket-brigade devices), consisting of enhancement-type transistors of the same conductivity type (N-channel or P-channel) which are arranged in series with their controlled current paths, with the drain and gate terminals of these transistors each being bridged by a capacitor, and with the gate terminals of the odd-numbered transistors being controlled in common by a first preferably rectangular clock signal, and the gate terminals of the even-numbered transistors, being controlled in common by a second, preferably rectangular, equi-frequency clock signal whose effective pulses are lying in the gaps between the effective pulses of the first clock signal, with said output circuit containing a terminating enhancement type transistor of the same conductivity type which, with its controlled current path, is arranged in series with the last delaying transistor of the MOS-bucket-brigade device, with the gate terminal thereof being applied to that particular clock signal to which the penultimate delaying transistor is connected, and whose drain terminal is applied to a constant supply voltage, and containing an output transistor in a source-follower circuit whose gate terminal is applied to the point connecting the last delaying transistor to the terminating transistor, and whose drain terminal is applied to the constant supply voltage, wherein the improvement comprises that the terminal on the gate side of the capacitor (Cn) associated with the last delaying transistor (Tn) is not connected to the gate terminal thereof, but to the source terminal of the output transistor (Tb), that the gate terminal of the terminating transistor (Ta) is applied via an additional capacitor (Cz) to that particular clock signal (F1) to which the penultimate delaying transistor (Tm) is applied, and that the drain terminal of the terminating transistor (Ta), via an enhancement-type transistor (Td) of the same conductivity type, connected as a diode by directly connecting both the drain and the gate terminals, is connected to the gate terminal thereof.

It is the object of the invention as defined in claim 1, therefore, to provide an output circuit for MOS-bucket-brigade devices, in which the clock proportion is reduced and in which, moreover, the appearing d.c. drift of the output signal, as compared with the conventional arrangement, is likewise reduced.

BRIEF DESCRIPTION OF THE DRAWINGS

The present invention will become more readily apparent from the following detailed description taken in conjunction with the accompanying drawings in which.

DETAILED DESCRIPTION OF THE PREFERRED EMBODIMENT

Figure 1:
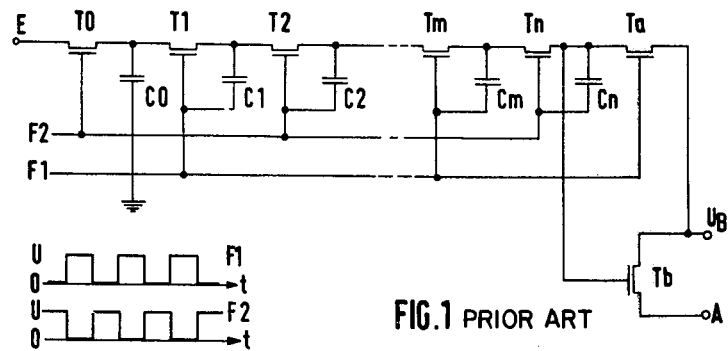
FIG. 1 is a circuit diagram of an MOS-bucket-brigade device having an output circuit according to the prior art.

In the following the invention will now be explained in greater detail with reference being had to the further figures of the drawing. In the example of embodiment shown in FIG. 3 there are shown, similar as in FIG. 1, several stages of the bucket-brigade circuit, i.e. the input stage including the transistor T0 and the capacitor C0, the two first delaying transistors T1, T2, the penultimate delaying transistor Tm and the last delaying transistor Tn with the associated capacitors C1, C2, Cm, Cn. The capacitor C0 is connected to the zero point of the circuit, i.e. to ground. As in the conventional arrangement according to FIG. 1, the control current path of the terminating transistor Ta is arranged in series with the control current path of the last transistor Tn, with the drain electrode thereof being applied to the constant supply voltage $U_B$, and with the gate terminal thereof, of course, unlike in the conventional arrangement, only being connected capacitively via the additional capacitor Cz, to the clock signal F1, which also controls the penultimate, delaying transistor Tm. Moreover, between the gate terminal of the terminating transistor Ta and the constant supply voltage $U_B$, there is arranged the transistor Td connected as a diode, with this property being achieved in that the gate and the drain terminals thereof are connected directly to one another, and applied to the constant supply voltage $U_B$.

To the point connecting the controlled current paths of both the last delaying transistor Tn and the terminating transistor Ta, similar as in the conventional arrangement according to FIG. 1, there is connected the gate terminal of the output transistor Tb, with this terminal, via the capacitor Cn, being connected to the source terminal thereof, hence to the output A. The terminal of the capacitor Cn on the gate side, is thus no longer applied to the gate of the associated transistor Tn in the example of embodiment shown in FIG. 3.

Figure 2:
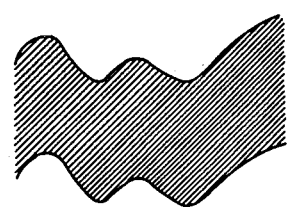
FIG. 2 is a diagram of the envelope curve enveloping the clock frequency voltage of the circuit in FIG. 1.
Figure 4:
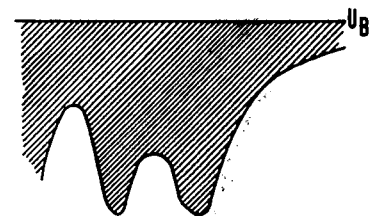
FIG. 4 is a diagram of the envelope curve enveloping the clock frequency voltage of the circuit in FIG. 3.

By including the additional capacitor Cz in the input control circuit of the terminating transistor Ta it is achieved that this transistor, at the times when the clock signal F1 assumes its amplitude U, is so strongly driven into saturation (the gate terminal of the transistor Ta is then applied to the sum of the voltage $U_B+U$) that the point connecting the control current paths of both the last delaying transistor Tn and the terminating transistor Ta will practically come to lie on the potential of the supply voltage $U_B$. Accordingly, at these times, and unlike in the conventional arrangement, not the full clock signal amplitude, but only a clock signal restricted to this constant potential will appear at this particular connecting point, which is the first prerequisite for effecting the intended reduction of the clock proportion in the output signal. Therefore, in FIG. 4, the upper limitation of the "band" of the output signal, as explained hereinbefore with reference to FIG. 2, is shown to have the shape of a horizontal line.

Figure 3:
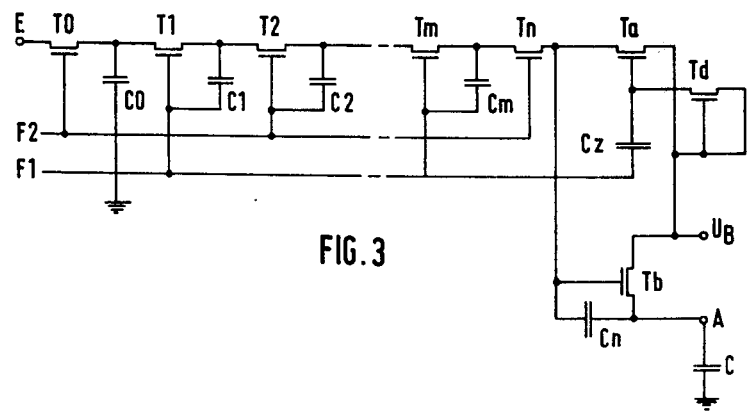
FIG. 3 is a circuit diagram of an MOS bucket-brigage device having an output circuit according to this invention.

Moreover, by splitting the connection as provided for according to the invention, between the capacitor Cn associated with the last delaying transistor Tn, and the gate terminal of the transistor Tn, and by connecting on the gate side the terminal of the capacitor Cn to the source terminal of the output transistor Tb, there is achieved the following: The capacitor Cn, serving as the last charge-storage device ("bucket"), is supposed to have approximately the same capacitance as the remaining capacitors C1 . . . Cm. On the other hand, the signal amplitude at the gate terminal of the output transistors Tb is supposed to be as high as possible. These two requirements, however, cannot be brought into agreement with one another if, as first considered by the inventor, the terminal on the gate side of the capacitor Cn is applied to ground. However, if the terminal, on the gate side, is applied to the source terminal of the output transistor Tb, there will result the desired high signal amplitude at the gate terminal of this transistor, as well as the required capacitance of the capacitor Cn in connection with the outer circuit capacitances applied to the output A and which, in FIG. 3, are indicated by the capacitor C being connected to ground. If, while the clock signal F2 assumes its amplitude U, the charge of the capacitor Cm were to be transferred to the capacitor Cn owing to the transistor Tn becoming conductive, then at first, owing to the outer capacitances C, the potential at the source terminal of the output transistor Tb would remain constant until the charge transfer from the capacitor Cm to the capacitor Cn is completed, and only thereafter, the output transistor Tb, owing to its source-follower function, will transfer the voltage variation at its gate terminal, to the output A. The effect of the capacitor Cn in conjunction with the outer circuit capacitances C, accordingly, may well be compared with that of a so-called bootstrap capacitance. In addition thereto, the remaining envelope curve shows to have a higher amplitude than any of the two envelope curves in the conventional arrangement.

What is claimed is:

1. An output circuit for bucket-brigade circuits consisting of insulated-gate field-effect transistors (MOS-bucket-brigade devices), consisting of enhancement-type transistors of the same conductivity type (N-channel or P-channel) which are arranged in series with their controlled current paths, with the drain and gate terminals of these transistors each being bridged by a capacitor, and with the gate terminals of the odd-numbered transistors being controlled in common by a first preferably rectangular clock signal, and the gate terminals of the even-numbered transistors, being controlled in common by a second, preferably rectangular, equifrequency clock signal whose effective pulses are lying in the gaps between the effective pulses of the first clock signal, with said output circuit containing a terminating enhancement type transistor of the same conductivity type which, with its controlled current path, is arranged in series with the last delaying transistor of the MOS-bucket-brigade device, with the gate terminal thereof being connected to that particular clock signal to which the penultimate delaying transistor is connected, and whose drain terminal is connected to a constant supply voltage, and containing an output transistor in a source-follower circuit whose gate terminal is connected to the point connecting the last delaying transistor to the terminating transistor, and whose drain terminal is connected to the constant supply voltage, wherein the improvement comprises that the capacitor (Cn) connected to the drain terminal of the last delaying transistor (Tn) is not connected to the gate terminal thereof, but to the source terminal of the output transistor (Tb), that the gate terminal of the terminating transistor (Ta) is connected via an additional capacitor (Cz) to that particular clock signal (F1) to which the penultimate delaying transistor (Tm) is connected, and that the drain terminal of the terminating transistor (Ta), via an enhancement-type transistor (Td) of the same conductivity type, connected as a diode by directly connecting both the drain and the gate terminals, is connected to the gate terminal thereof.

* * * * *